US009453876B2

(12) United States Patent
Gettemy et al.

(10) Patent No.: US 9,453,876 B2
(45) Date of Patent: Sep. 27, 2016

(54) SYSTEMS AND METHODS FOR TESTING A PERIPHERAL INTERFACING WITH A PROCESSOR

(71) Applicant: Apple Inc., Cupertino, CA (US)

(72) Inventors: Shawn Gettemy, San Jose, CA (US); Wei Yao, Fremont, CA (US); Ahmad Al-Dahle, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 946 days.

(21) Appl. No.: 13/657,732

(22) Filed: Oct. 22, 2012

(65) Prior Publication Data

US 2013/0110447 A1  May 2, 2013

Related U.S. Application Data

(62) Division of application No. 12/283,949, filed on Sep. 16, 2008, now Pat. No. 8,294,482.

(51) Int. Cl.
| | |
|---|---|
| *G01R 31/26* | (2014.01) |
| *G01R 31/28* | (2006.01) |
| *G06F 11/273* | (2006.01) |
| *G09G 3/00* | (2006.01) |

(52) U.S. Cl.
CPC ....... *G01R 31/2834* (2013.01); *G06F 11/2733* (2013.01); *G09G 3/006* (2013.01)

(58) Field of Classification Search
CPC . G01R 31/2834; G01L 15/22; G01L 15/183; H04L 25/028; G01N 2021/8832
USPC .............. 324/760.02, 537, 770, 160.02, 500; 345/87–104, 204, 690
See application file for complete search history.

(56) References Cited

U.S. PATENT DOCUMENTS

| | | | |
|---|---|---|---|
| 7,671,628 B2 | 3/2010 | Alameh et al. | |
| 7,728,605 B2 | 6/2010 | Gervais | |
| 7,818,641 B2 | 10/2010 | Whetsel | |
| 2002/0149575 A1 | 10/2002 | Moon | |
| 2003/0146907 A1* | 8/2003 | Boals .................. | G06F 3/03545 345/179 |
| 2003/0158640 A1 | 8/2003 | Pillar et al. | |
| 2004/0092135 A1 | 5/2004 | Hofmeister et al. | |
| 2005/0025449 A1 | 2/2005 | Dirkson et al. | |
| 2009/0235120 A1* | 9/2009 | Gettemy ............. | G06F 11/2733 714/30 |

(Continued)

OTHER PUBLICATIONS

K Boyce "An Introduction to the Mobile Industry Processor Interface (MIPI) Alliance Standard[;] Serial Low-Power Inter-Chip Media Bus (SLIMbus.TIM)," National Semiconductor Audio Products Group, URL https://www.national.com/appinfo/audio/files/intro.sub.--to.sub.--SLIMbus-.pdf, 20 pages, accessed on Oct. 2, 2008.

(Continued)

*Primary Examiner* — Melissa Koval
*Assistant Examiner* — Trung Nguyen
(74) *Attorney, Agent, or Firm* — Gazdzinski & Associates, PC

(57) ABSTRACT

Systems and methods for testing a peripheral in accordance with a MIPI protocol are provided. A test system can test a peripheral by providing user-5 specified control over a test processor (which is substantially the same processor the peripheral will interface with when installed) to test, calibrate, or both test and calibrate the peripheral. The test processor can communicate with the peripheral according 10 to the MIPI protocol, thereby effectively providing an actual "in-device" environment for testing and/or calibrating the peripheral.

20 Claims, 3 Drawing Sheets

(56) References Cited

U.S. PATENT DOCUMENTS

2010/0077211 A1    3/2010  Lee
2012/0126872 A1*   5/2012  Frank ................. H03K 3/84
                                                       327/299
2012/0265528 A1*  10/2012  Gruber ............... G10L 15/18
                                                       704/235

OTHER PUBLICATIONS

"SLIMbus.TM. Host Controller IP," Arasan Chip Systems, Inc., Version 1.4, 2008, URL http://www.arasan.com/products/prod.sub.--overview/mipi/SLIMbus--Host-pb.pdf, 2 pages, accessed on Oct. 2, 2008.

* cited by examiner

SYSTEMS AND METHODS FOR TESTING A PERIPHERAL INTERFACING WITH A PROCESSOR

This application is a divisional of and claims priority to co-owned U.S. patent application Ser. No. 12/283,949 filed Sep. 16, 2008, and entitled "SYSTEMS AND METHODS FOR TESTING A PERIPHERAL INTERFACING WITH A PROCESSOR ACCORDING TO A HIGH-SPEED SERIAL INTERFACE PROTOCOL", (issued as U.S. Pat. No. 8,294, 482), which claims the benefit of U.S. provisional patent application 61/069,398, filed Mar. 14, 2008, each of the foregoing incorporated by reference herein in its entirety.

BACKGROUND OF THE INVENTION

This invention relates to testing systems, and in particular to testing systems that test peripherals that interface with a processor using a particular communications protocol.

Processors or systems-on-a-chip (SOC) are ubiquitous in electronic devices and often serve as the central hub of data exchange between the processor and peripherals such as memory, cameras, displays, or communications devices. The SOC may include several ports or buses for interfacing with the peripherals. This enables more efficient integration of peripherals, resulting in electronic devices such as laptops, phones, PDAs (personal digital assistants), personal media players, etc., that offer more features and power savings than before.

Such integration may require that the peripherals be tested, tuned, or calibrated in order to provide an electronic device that meets minimum performance criteria. Peripherals may need to be tested and/or calibrated because each peripheral may be unique and thus may have slightly different operating characteristics. For example, liquid crystal displays (LCDs) of the same make and model can be unique and differ from one another. Thus, merely interfacing any LCD with the SOC of an electronic device and operating each LCD according to the same fixed set of parameters may not yield desired performance.

Testing and/or calibrating peripherals after they have been installed into the electronic device are not practical, and in many situations are not possible. This may be due to the closed nature of the integrated SOC/peripheral solution and the specific communications protocols used to conduct communications between the SOC and the peripheral. One protocol, known as a mobile industry processor interface (MIPI) advantageously enables a processor to substantially directly communicate with a peripheral, thereby further enabling tighter system integration, but also making it more difficult or practically impossible to test and/or calibrate the peripheral after it is installed in the device.

Accordingly, what is needed is a test system to test a peripheral in accordance with a MIPI protocol.

SUMMARY

Systems and methods for testing a peripheral in accordance with a MIPI protocol are provided. A test system can test a peripheral by providing user-specified control over a test processor (which is substantially the same processor the peripheral will interface with when installed) to test, calibrate, or both test and calibrate the peripheral. The test processor can communicate with the peripheral according to the MIPI protocol, thereby effectively providing an actual "in-device" environment for testing and/or calibrating the peripheral.

In one embodiment, a test system can include a test computer and a testing module. The testing module may serve as an interface between a peripheral (e.g., an LCD subassembly or camera) and the test computer and includes a test processor. The test processor may be the same make and model as the processor the peripheral will interface with when it is installed into an end product (e.g., an electronic device). A difference with the test processor is that it is 'opened up" and permits the test computer to run tests or calibration events on the peripheral through the processor, which uses the MIPI protocol to communicate with the peripheral.

In another embodiment, the test system may be used to test and adjust various settings of an LCD attached to the testing module. For example, the test system may adjust the flicker and gamma parameters of the LCD to obtain optimal LCD performance. After those parameters are determined, the test system may program an LCD driver with those determined parameters, for example, by writing those parameters to memory in the LCD driver.

In yet another embodiment, an electronic device is provided that includes a peripheral (e.g., LCD) that was tested and calibrated by a MIPI test system.

In a further embodiment, a method for calibrating a liquid crystal display (LCD) is disclosed. The LCD includes a memory and at least one parameter setting. The method includes interfacing the LCD to a test system, using the test system to communicate with the LCD according to a high-speed serial interface (HSSI) protocol, and calibrating the LCD with the test system.

In an additional embodiment, a test system for calibrating a Liquid Crystal Display (LCD) is disclosed. The test system includes a test module containing a test processor electrically coupled to the test processor and electrically coupled to a test computer interface and a peripheral interface, the test processor operative to communicate with the LCD configured to couple to the peripheral interface according to a high-speed serial interface (HSSI) protocol, and the test processor operative to respond to commands provided by a test computer configured to couple to test computer interface. The test module also includes a non-transitory computer readable apparatus having a storage medium with at least one computer program stored thereon, the at least one computer program configured to, when executed on the test processor interface the LCD to the test system and calibrate the LCD by adjusting at least one parameter setting. The test module also contains a dock electrically coupled to the test processor.

In another embodiment a method of operating a test module to calibrate a Liquid Crystal Display (LCD) is disclosed. The method includes coupling the test module to the LCD using a high-speed serial interface (HSSI) protocol, testing the LCD, and adjusting at least one parameter of the LCD based on the testing.

In another embodiment, a test module is disclosed. In one variant, the test module includes a non-transitory computer-readable storage medium comprising instructions stored thereon, the instructions being configured to, when executed by a processor on the test module: interface a liquid crystal display (LCD) to a test system, the LCD comprising a memory and one or more parameters; use the test system to communicate with the LCD according to a high-speed serial interface (HSSI) protocol; and calibrate the LCD with the test system.

BRIEF DESCRIPTION OF THE DRAWINGS

The above and other aspects and advantages of the invention will become more apparent upon consideration of the following detailed description, taken in conjunction with the accompanying drawings, in which like reference characters refer to like parts throughout, and in which.

DETAILED DESCRIPTION

Figure 1:
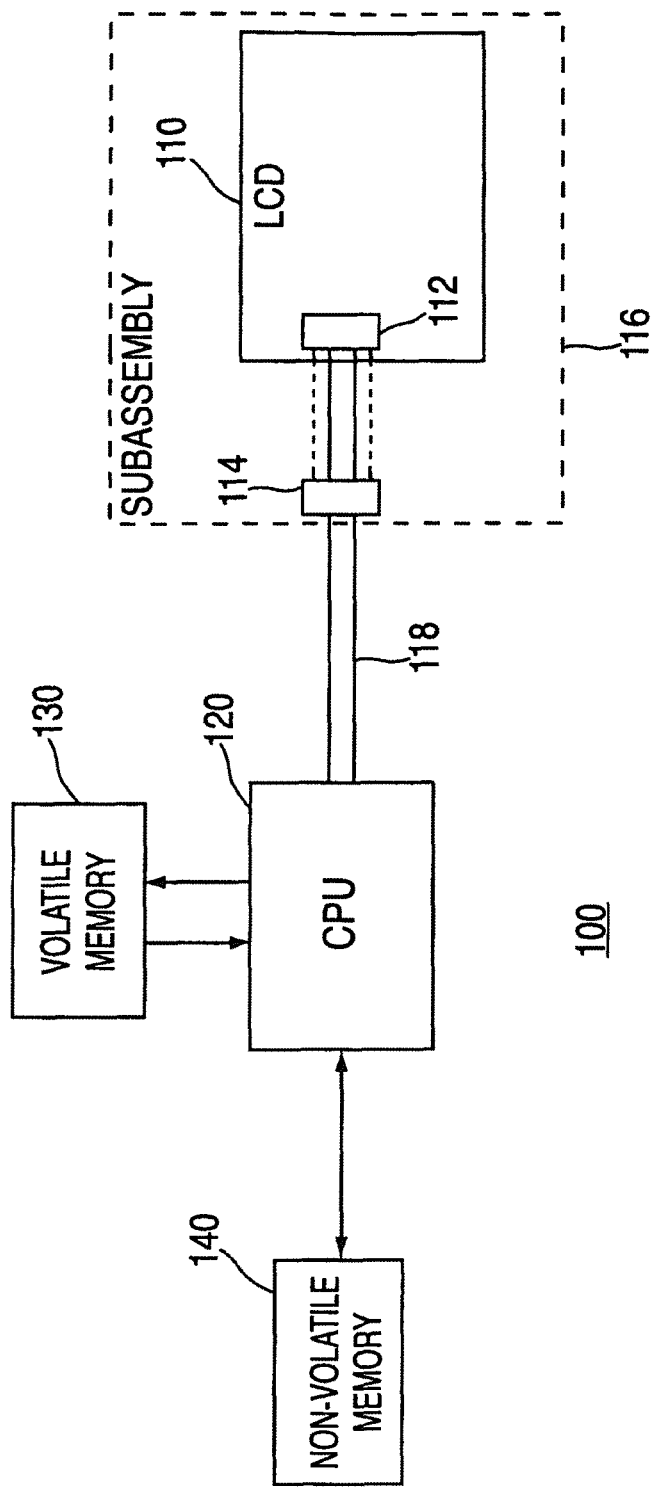
FIG. 1 is an illustrative block diagram of an end-use system including a peripheral that was tested and calibrated by a testing platform in accordance with an embodiment of the invention.

FIG. 1 is an illustrative block diagram of a system 100 including an LCD 110 that was tested and calibrated by a testing platform (e.g., as shown in a later FIG.) in accordance with an embodiment of the invention. As shown, LCD 110 may have LCD driver 112 mounted thereon. LCD driver 112 may be connected to connector 114 via a flex connection outlined by the dotted lines between elements 112 and 114). The combination of LCD 110, driver 112, and connector 114 may be a subassembly (denoted by dashed box 116) that is tested by a testing platform according to the invention prior to assembly of system 100.

Connector 114 may be electrically coupled to processor 120 via communications paths 118. Communications paths 118 may be any suitable path for transmitting data signals. For example, communications paths 118 may be a wired link or a fiber optic link.

Processor or CPU 120 may transmit and/or receive data according to a particular protocol. In one embodiment, the protocol may be a MIPI protocol, which is a differential-ended, high-speed, serial interface (HSSI) used to interface processor 120 and LCD 110. Structurally, MIPI uses a pair of wires for each lane being used to transmit data. For example, in one embodiment, a clock lane and at least one data lane may be used to transmit information to LCD 110. The data may be transmitted in packets. For example, a packet may include header information and data. The header information may specify if the data is control information (which may be used to control, for example, workflow) or image information (which may be used to generate red/green/blue values for pixels in the display). Advantages of using MIPI include reduced number of wires, faster charge/discharge of parasitic capacitance, reduced voltage swing, reduced number of pins, and increased signal integrity. To achieve optimal performance, various portions of the peripheral interfacing with the processor using MIPI (e.g., LCD driver 112) may require customization. These customized parts may require custom programming, which is provided using a testing system in accordance with embodiments of this invention.

As also shown in FIG. 1, system 100 can include volatile memory 130 (e.g., ram or DDR) and non-volatile memory 140 (e.g., flash or a hard-disk). Processor 120 can communicate with memories 130 and 140 to obtain data as needed and provide it, for example, to a peripheral. For example, when system 100 displays content on LCD 110, processor 120 may obtain content from non-volatile memory 140, buffer a frame of content in volatile memory 130, and provide the buffered content to LCD 110 over path 118, according to the MIPI protocol, for display.

Using the MIPI protocol, processor 120 can substantially directly communicate with LCD driver 112. That is, there is no need for bridge circuitry, which is used in connection with MPL (i.e., single-ended HSSI) protocol systems, to be disposed between processor 120 and connector 114. (MPL is the acronym for the Mobile Pixel Link communications protocol.) The MIPI protocol offers substantial advantages over its MPL counterpart in terms of performance and system integration. In terms of integration, processor 120 can process data retrieved from memory 130 or 140 according to the MIPI protocol and provide it to LCD 110. Thus, because processor 120 is processing data according to the MIPI protocol, peripherals (such as LCD 110) interfacing with processor 120 may need to be tested and/or calibrated to ensure optimal operation. For example, it may be necessary to test whether a peripheral is properly receiving or processing data according to the MIPI protocol. In another example, a test may need to be run to determine if the peripheral is operating according to predetermined criteria.

Figure 2:
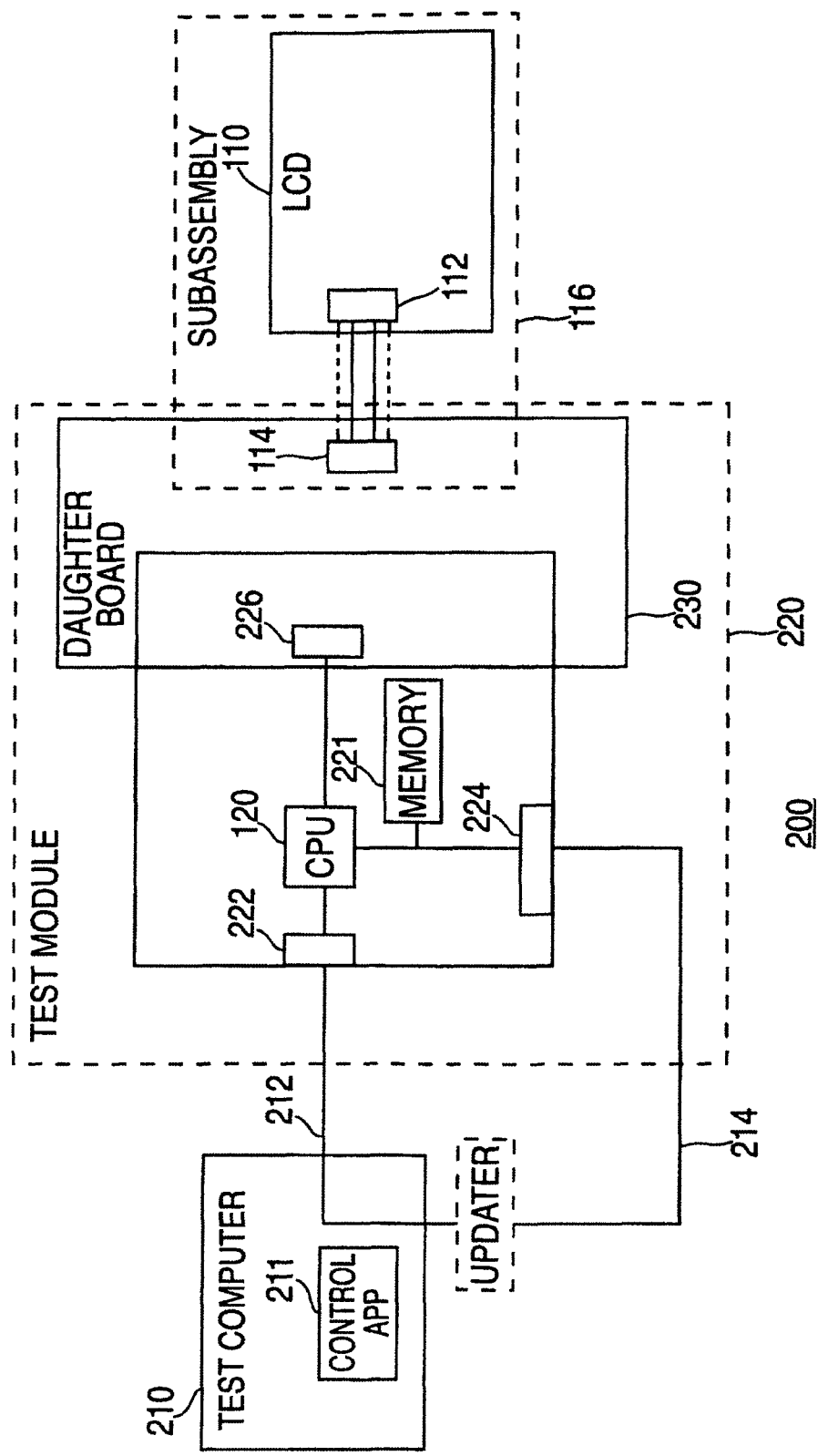
FIG. 2 shows an illustrative test system according to an embodiment of the invention.

FIG. 2 shows an illustrative test system 200 according to an embodiment of the invention. Test system 200 can include test computer 210, test module 220, and LCD subassembly 116. Module 220 can include test processor 120, dock 222, dock 224, interface 226, and daughter-board 230. Test processor 120 may be another instance of the same processor as that shown in FIG. 1. Using the same processor (i.e., processor 120) in test system 200 that is used in end-use system 100 advantageously promotes testing and calibration of LCD subassembly 116. (The phrase "end-use" just refers to the final hook-ups or connections to peripheral 116 per se.) It will be understood that the term "same processor" refers to the same make and model processor, both instances of which may be operating according to the same film-ware instruction set (stored, e.g., in memory 221). If it is desired to update the firmware or other software of test system 200, test computer may provide such updates via dock 224.

Test computer 210 may be electrically coupled to test processor 120 via path 212 and dock 222. Through path 212, test computer 210 may control processor 120 to test a peripheral (shown as LCD subassembly 116) attached to module 220. Commands and data provided by test computer 210 may be processed by processor 120 and provided to interface 226, which routes the commands and data through daughter-board 230 to connector 114. After test computer 210 finishes testing and/or calibrating subassembly 116, subassembly 116 may be removed and a new one put in its place.

Test computer 210 may include software (e.g., a control application) 211 to control test module 220 and test a peripheral (shown as LCD subassembly 116) attached to test module 220. The software 211 may test any number of parameters related to the peripheral 116 or the system (e.g., processor). For example, in an embodiment where the peripheral is an LCD subassembly, the test computer 210 may test display 110 for flicker and gamma performance, test the system for serial interface link performance, and test the system for optical performance. In addition, test computer 210 may be able to adjust various parameters affiliated with the peripheral. In the LCD subassembly 116 embodiment, adjustments may be made for flicker and gamma values. The adjustments may be made at the direction of a user who manually directs the adjustments though test computer 210, or adjustments may be performed automatically by test computer 210. Automatic adjustments may be performed, for example, by having a camera (not shown) monitor the LCD screen and feed back data (e.g., flicker and gamma values) to test computer 210, which uses that data to make adjustments as necessary.

Test computer 210 may also be able to program peripherals attached to module 220. For example, after test computer 210 determines the appropriate flicker and gamma values for subassembly 116, test computer 210 may program an eeprom (not shown separately) located in LCD driver 112 so that it operates according to the flicker and gamma values determined to work best for this particular subassembly 116.

One of the advantages of test system 200 is that it permits test computer 210 to directly access and control MIPI protocol commands in processor 120.

Figure 3:
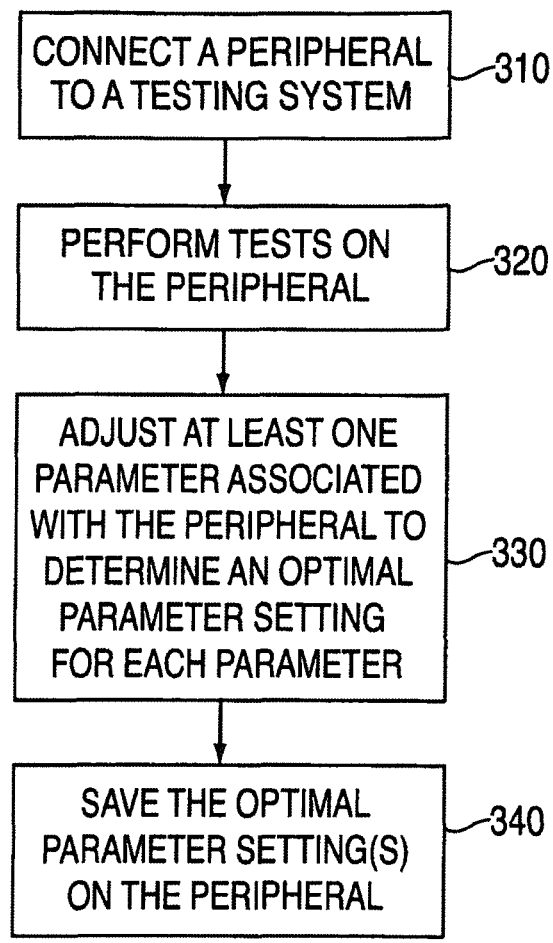
FIG. 3 is a flow chart of illustrative steps that may be performed by a test system in accordance with an embodiment of the invention.

FIG. 3 is a flow chart of illustrative steps that may be performed by a test system (e.g., as in FIG. 2) in accordance with an embodiment of the invention. Starting at step 310, a peripheral (e.g., an LCD subassembly 116) is connected to a testing system (e.g., daughter-board 230 of FIG. 2). At step 320, tests may be performed on the peripheral using a test processor (e.g., 120) processing data and commands supplied by a test computer (e.g., 120). If desired, tests may be performed to evaluate the communications link (e.g., 112, 114, etc.) between the test processor (e.g., 120) and the peripheral (e.g., 116).

At step 330, at least one parameter associated with the peripheral (e.g., 116) is adjusted to determine an optimal parameter setting for such parameter(s). It will be understood that steps 320 and 330 may be performed in conjunction with each other. The parameter adjustments may be performed by the test processor (e.g., 120) under the direction of the test computer (e.g., 210). After all adjustable parameters have been found, the optimal parameter settings(s) may be saved on the peripheral (e.g., 116), as indicated by step 340. The test processor (e.g., 120) may save the settings in on-board memory mounted to the peripheral (e.g., 116).

It will be appreciated that these steps are merely illustrative, and that additional steps may be included or existing steps may be omitted. For example, a step may be added to account for manual input of parameter adjustments by a test system user.

The foregoing describes systems and methods for testing peripherals that interface with a processor using a MIPI protocol. Those skilled in the art will appreciate that the invention can be practiced by other than the described embodiments, which are presented for the purpose of illustration rather than of limitation, and the invention is limited only by the claims which follow.

What is claimed is:

1. A test system for calibrating a Liquid Crystal Display (LCD), the test system comprising:
   a test module comprising:
      a test processor electrically coupled to a test computer interface and a peripheral interface, the test processor operative to communicate with the LCD via the peripheral interface according to a high-speed serial interface (HSSI) protocol, and the test processor operative to respond to commands provided by a test computer via the test computer interface via a dock that is electrically coupled to the test processor; and
      a non-transitory computer readable apparatus having a storage medium with at least one computer program stored thereon, the at least one computer program configured to, when executed on the test processor:
         interface the LCD to the test system; and
         calibrate the LCD through an adjustment of at least one parameter setting.

2. The test system of claim 1, further comprising the test computer, the test computer comprising a control application operative to perform at least one test on the LCD using the test processor.

3. The test system of claim 1, further comprising the test computer, the test computer comprising a control application operative to adjust the at least one parameter setting on the LCD using the test processor.

4. The test system of claim 1, further comprising a camera, the camera operative to monitor the LCD.

5. The test system of claim 4, wherein the at least one computer program is further configured to, when executed on the test processor, receive data from the camera, the data associated with the at least one parameter setting.

6. The test system of claim 1, wherein the LCD comprises a memory that is operative to store calibration information.

7. A method for calibrating a liquid crystal display (LCD), the LCD comprising a memory and at least one parameter setting, the method comprising:
   interfacing the LCD to a test system;
   using the test system to communicate with the LCD according to a high-speed serial interface (HSSI) protocol; and
   calibrating the LCD with the test system, wherein the calibrating the LCD comprises:
      adjusting the at least one parameter setting;
      determining an optimal parameter setting for each parameter setting; and
      storing the optimal parameter setting in the memory.

8. The method of claim 7, wherein the using the test system comprises:
   controlling a test processor with a test computer, wherein the test computer communicates with the LCD according to the high-speed serial interface protocol.

9. The method of claim 7, wherein the calibrating the LCD comprises performing at least one test on the LCD using the test system.

10. The method of claim 7, wherein the calibrating the LCD comprises adjusting the at least one parameter setting of the LCD using the test system.

11. The method of claim 10, wherein the at least one parameter setting comprises a flicker parameter.

12. The method of claim 10, wherein the at least one parameter setting comprises a gamma parameter.

13. The method of claim 7, wherein the HSSI protocol comprises a Mobile Industry Processor Interface (MIPI) protocol.

14. The method of claim 7, wherein the HSSI protocol allows substantially direct communication with a driver of the LCD.

15. The method of claim 7, wherein:
   the test system comprises a camera; and
   the calibrating the LCD comprises feeding back imaging data associated with the at least one parameter settings, using at least the camera, to make adjustments to the at least one parameter settings on the LCD.

16. A test module, comprising a non-transitory computer-readable storage medium comprising instructions stored thereon, the instructions being configured to, when executed by a processor on the test module:
   interface a liquid crystal display (LCD) to a test system, the LCD comprising a memory and one or more parameters;
   use the test system to communicate with the LCD according to a high-speed serial interface (HSSI) protocol; and
   calibrate the LCD with the test system, wherein the calibration of the LCD comprises:

adjustment of the one or more parameters;
determination of an optimal parameter setting for each of the one or more parameters; and
storage of the optimal parameter in the memory.

17. The test module of claim 16, wherein the test system comprises a camera, the camera being configured to monitor the LCD.

18. The test module of claim 17, wherein the instructions are further configured to, when executed by the processor, receive data from the camera, the data being associated with one or more parameters.

19. The test module of claim 16, wherein the calibration of the LCD with the test system further comprises performance of at least one test on the LCD by the test system.

20. The test module of claim 16, wherein the one or more parameters comprise one or more of: a flicker parameter and a gamma parameter.

\* \* \* \* \*

UNITED STATES PATENT AND TRADEMARK OFFICE
CERTIFICATE OF CORRECTION

PATENT NO.      : 9,453,876 B2
APPLICATION NO. : 13/657732
DATED           : September 27, 2016
INVENTOR(S)     : Shawn Gettemy et al.

Page 1 of 1

It is certified that error appears in the above-identified patent and that said Letters Patent is hereby corrected as shown below:

Currently reads ((57) ABSTRACT):

"Systems and methods for testing a peripheral in accordance with a MIPI protocol are provided. A test system can test a peripheral by providing user-5 specified control over a test processor (which is substantially the same processor the peripheral will interface with when installed) to test, calibrate, or both test and calibrate the peripheral. The test processor can communicate with the peripheral according 10 to the MIPI protocol, thereby effectively providing an actual "in-device" environment for testing and/or calibrating the peripheral."

Should read:

--Systems and methods for testing a peripheral in accordance with a MIPI protocol are provided. A test system can test a peripheral by providing user specified control over a test processor (which is substantially the same processor the peripheral will interface with when installed) to test, calibrate, or both test and calibrate the peripheral. The test processor can communicate with the peripheral according to the MIPI protocol, thereby effectively providing an actual "in-device" environment for testing and/or calibrating the peripheral.--

Signed and Sealed this
Twenty-fourth Day of January, 2017

Michelle K. Lee
*Director of the United States Patent and Trademark Office*